US008258063B2

(12) United States Patent
Xu et al.

(10) Patent No.: US 8,258,063 B2
(45) Date of Patent: Sep. 4, 2012

(54) METHOD FOR MANUFACTURING A METAL GATE ELECTRODE/HIGH K DIELECTRIC GATE STACK

(75) Inventors: Qiuxia Xu, Beijing (CN); Yongliang Li, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/002,079

(22) PCT Filed: Sep. 21, 2010

(86) PCT No.: PCT/CN2010/001456
§ 371 (c)(1),
(2), (4) Date: Dec. 30, 2010

(87) PCT Pub. No.: WO2011/124003
PCT Pub. Date: Oct. 13, 2011

(65) Prior Publication Data
US 2011/0256704 A1 Oct. 20, 2011

(30) Foreign Application Priority Data
Apr. 9, 2010 (CN) .......................... 2010 1 0145261

(51) Int. Cl.
*H01L 21/311* (2006.01)
(52) U.S. Cl. ................................. 438/720; 257/E21.31
(58) Field of Classification Search .................. 438/706, 438/720; 257/E21.232, E21.245, E21.31, 257/E21.222
See application file for complete search history.

(56) References Cited

U.S. PATENT DOCUMENTS

| 4,778,532 A | * | 10/1988 | McConnell et al. ............ 134/10 |
| 2004/0113171 A1 | | 6/2004 | Chiu et al. |
| 2005/0081781 A1 | * | 4/2005 | Lin et al. ...................... 117/104 |
| 2010/0062591 A1 | | 3/2010 | Lin et al. |

FOREIGN PATENT DOCUMENTS

| CN | 1327260 A | 12/2001 |
| CN | 101620997 A | 1/2010 |
| CN | 101673686 A | 3/2010 |

OTHER PUBLICATIONS

International Search Report and Written Opinion dated Jan. 13, 2011, from the China Patent Office in related Application No. PCT/CN2010/001456 (9 pages).

(Continued)

*Primary Examiner* — William D Coleman
(74) *Attorney, Agent, or Firm* — Osha Liang LLP

(57) ABSTRACT

A method of manufacturing a metal gate/high K dielectric gate stack includes the steps of: forming an interfacial layer of SiON or $SiO_2$ on a silicon substrate; depositing a high K dielectric film on the interfacial layer; performing a rapid thermal anneal of the high K dielectric film; depositing a TaN metal gate electrode film on the high K dielectric film; depositing a polysilicon gate layer on the TaN metal gate electrode film, and then depositing a hard mask layer; patterning a photoresist mask, and performing an anisotropic etching of the hard mask layer; removing the photoresist mask, and etching the polysilicon by reactive ion etching with the hard mask as masking layer using a mixed gas of $Cl_2$/HBr; and etching the TaN metal gate electrode/high K dielectric gate stack by reactive ion etching with the hard mask as masking layer using $BCl_3$-based etchant gas.

9 Claims, 1 Drawing Sheet

OTHER PUBLICATIONS

Li, Yongliang, et al., "Wet etching characteristics of a HfSiON high-k dielectric in HF-based solutions"; Journal of Semiconductors, vol. 31, No. 3, Mar. 2010; pp. 036001-1 through 036001-5.

Espacenet English Abstract for CN 101673686 (1 page), Mar. 17, 2010.

Espacenet English Abstract for CN 1327260 (1 page), Dec. 19, 2001.

Espacenet English Abstract for CN 101620997 (1 page), Jan. 6, 2010.

* cited by examiner

METHOD FOR MANUFACTURING A METAL GATE ELECTRODE/HIGH K DIELECTRIC GATE STACK

BACKGROUND OF THE INVENTION

1. Field of Invention

The present invention relates to semiconductor technology, and more particularly, to a method for manufacturing a metal gate electrode/high K dielectric gate stack. The invention can be applied to a high-performance complementary metal-oxide-semiconductor (CMOS) device at 32 nm node and beyond.

2. Description of Prior Art

A dielectric having a high dielectric constant (K) and a metal gate electrode represent a tendency of development while a critical dimension of a CMOS device continue to further scale down. By using a high K dielectric, the gate leakage current can be substantially reduced, because a relatively large physical thickness can be achieved with the same equivalent oxide thickness (EOT). Furthermore, by using a metal gate electrode, a depletion effect of a polysilicon gate electrode and a penetration effect of boron can be eliminated, so that the device has an improved reliability and a reduced gate resistance. However, it still faces massive challenge to apply the metal gate electrode/high K dielectric stack to the CMOS technology. In particular, it is difficult to form a high K dielectric/metal gate electrode gate stack satisfying the requirements of device fabrication by etching in the gate-first CMOS process, because an etching rate, an etching selectivity, and an anisotropic etching profile of the gate stack can not be optimized easily at the same time. To overcome the difficulty in etching and to prevent ions from penetrating the metal gate electrode in the following step of high-dose source/drain implantation and annealing, a polysilicon/thin metal gate electrode stack can be used to replace a single thick metal gate. Even so, it still faces massive challenge to achieve a steep and anisotropic etching profile of a gate stack and a high etching selectivity to the silicon substrate and the hard mask.

SUMMARY OF THE INVENTION

An object of the present invention is to provide a method for manufacturing a metal gate electrode/high K dielectric gate stack, which provides a steep and anisotropic etching profile of the stack, and has a good etching selectivity with respect to a silicon substrate. The method is also completely compatible with a conventional CMOS process, has a low manufacturing cost, and is easy to be applied to a volume production of the integrated circuit.

To achieve the above object, there provides a method for manufacturing a metal gate electrode/high K dielectric gate stack, comprises:

Step 1) forming an interfacial layer of SiON or $SiO_2$ and a silicon substrate;

Step 2) depositing a high K dielectric film on the interfacial layer;

Step 3) performing a rapid thermal anneal of the high K dielectric film;

Step 4) depositing a TaN metal gate electrode film on the high K dielectric film;

Step 5) depositing a polysilicon gate layer on the TaN metal gate electrode film, and then depositing a hard mask layer;

Step 6) patterning a photoresist mask, performing an anisotropic etching of the hard mask layer by reactive ion etching so as to transfer the pattern of the photoresist mask into the hard mask layer;

Step 7) removing the photoresist mask, and etching the polysilicon gate by reactive ion etching with the hard mask as masking layer using a mixed gas of $Cl_2$/HBr;

Step 8) etching the TaN metal gate electrode/high K dielectric gate stack by reactive ion etching with the hard mask as masking layer using $BCl_3$-based etchant gas, which is anisotropic etching with high selectivity.

In the above method, prior to Step 1), the silicon substrate is immersed into a washing solution for about 2-10 minutes. The washing solution is a mixed solution of hydrofluoric acid, isopropanol and water in a volume ratio of about 0.2-1.5%: 0.01-0.10%:1%.

In Step 1) of the above method, the interfacial layer of SiON is formed by firstly implanting nitrogen ion and then performing a rapid thermal oxidation, or by firstly performing an oxidation and then performing plasma nitridation.

In Step 2) of the above method, the high K dielectric film is a doped Hf-based oxide, such as $HfO_2$, HfON, HfSiO, HfSiON, HfTaON, HfAlO, HfAlON, HfSiAlON, HfLaO, and HfLaON. The high K dielectric film is formed by physical vapor deposition (PVD), or metal-organic chemical vapor deposition (MOCVD), or atomic layer deposition (ALD).

In Step 3) of the above method, the rapid thermal anneal is performed at about 600-1000° C. for about 10-120 seconds.

In Step 4) of the above method, the TaN metal gate electrode film is formed by reactively sputtering with Ta target in a mixed gas of $N_2$/Ar, or by MOCVD or ALD.

In Step 5) of the above method, the hard mask layer is formed of silicon oxide, or silicon nitride or a stack thereof.

In Step 6) of the above method, the hard mask layer is etched by reactive ion etching using a fluorine-based etchant, such as $CF_4$, $CHF_3$, and $SF_6$.

In Step 8) of the above method, the $BCl_3$-based etchant is a mixed gas of $BCl_3/Cl_2/Ar/O_2$, with a flow rate of $BCl_3$ of about 20-120 sccm, a flow rate of $Cl_2$ of about 5-30 sccm, a flow rate of $O_2$ of about 2-15 sccm, and a flow rate of Ar of about 10-60 sccm; and an etching power of an upper electrode is about 120-450 W and an etching power of a lower electrode is about 30-200 W. The reaction chamber is maintained at an operating pressure of about 4-15 mTorr. The temperatures of the reaction chamber and the electrodes are about 50-150° C.

The present invention provides not only a steep etching profile of the stack, but also a good etching selectivity with respect to a silicon substrate. The reason for this is that the $BCl_3$ gas generates not only Cl which reacts with the metal to form a volatile product, but also BOClx which is also a volatile product, and thus $BCl_3$ gas erodes a metal oxide. Moreover, the $BCl_3$ gas can also etch a Hf-based high K material, since the high K material is typically made of a metal oxide. Furthermore, the $BCl_3$ gas reacts with the silicon substrate to form a Si—B bond which passivates the substrate and increases an etching selectivity with respect to the silicon substrate. In the present invention, a mixed gas of $BCl_3/Cl_2/$ Ar/a small amount of $O_2$, is used as an etchant gas for etching the TaN/high K dielectric stack at a high electric field and a low pressure. The inclusion of $Cl_2$ and $O_2$ facilitates formation of a steep etching profile. What's more, the high electric field and the low pressure also facilitate formation of a steep etching profile. The relatively high temperature of the reaction chamber and the electrodes facilitate exhaust of the reaction by-products. By optimizing the powers of the upper and lower electrodes, the pressures and composition of the gases, the present invention achieves a steep etching profile and a good etching selectivity with respect to a silicon substrate. Thus, there is less silicon loss in the process. Moreover, the inventive method is compatible with the conventional CMOS process and has a low manufacturing cost. It overcomes the difficulty in integrating a metal gate/high K dielectric gate stack into the advanced CMOS technology, and is easy to be applied to a volume production of the integrated circuit.

DETAILED DESCRIPTION OF PREFERRED EMBODIMENTS

Aiming at the challenges coming from that the high K dielectric /metal gate electrode new technology must be used in 32 nm/22 nm technology node, the present invention provides a method for manufacturing a metal gate/high K dielectric gate stack. The invention will be described in connection with the attached drawings so as to clarify its characteristic features. The embodiments given below are illustrative and not to be construed as limiting the invention.

Figure 1:
FIG. 1 shows an SEM image of the hard mask/polysilicon/ TaN metal gate/high K dielectric layer/$SiO_2$ interfacial layer/ silicon substrate stack fabricated according to the present invention.
Figure 2:
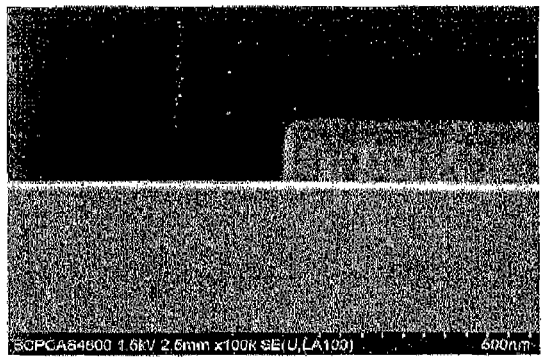
FIG. 2 shows an SEM image of the stack according to the present invention, after a reactive ion etching of the hard mask using a fluoride etchant, and a subsequent reactive ion etching of the polysilicon gate using a mixed gas of $Cl_2$/HBr and stopping on TaN metal.
Figure 3:
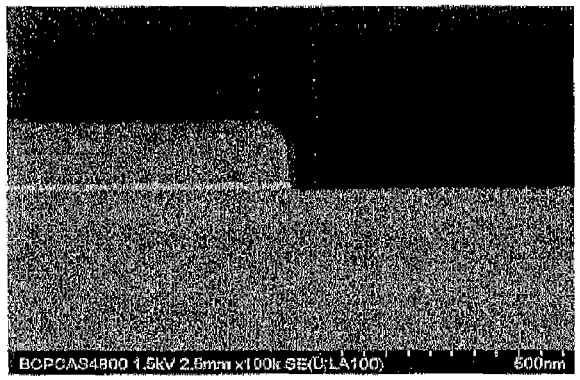
FIG. 3 shows an SEM image of the stack according to the present invention, after a reactive ion etching of the TaN metal gate electrode/high K dielectric gate stack using a mixed gas of $BCl_3$/$Cl_2$/$O_2$/Ar at the end of the process.

Step 1) firstly washing a silicon substrate by a conventional process, and then immersing it into a mixed solution of hydrofluoric acid, isopropanol and water in a volume ratio of about 0.2-1.5%:0.01-0.10%:1% for about 2-10 minutes, then rinsing it with deionized water, and drying it by spinning;

Step 2) forming an interfacial layer of SiON or $SiO_2$ on the silicon substrate, wherein the interfacial layer of SiON may be formed by firstly implanting nitrogen ion and then performing a rapid thermal oxidation, or by firstly performing an oxidation and then performing plasma nitridation;

Step 3) depositing a high K dielectric film on the interfacial layer, wherein the high K dielectric film is made of, for example, a doped Hf-based oxide, such as $HfO_2$, HfON, HfSiO, HfSiON, HfTaON, HfAlO, HfAlON, HfSiAlON, HfLaO, and HfLaON, and the high K dielectric film is formed by, for example, physical vapor deposition (PVD), or metal-organic chemical vapor deposition (MOCVD), or atomic layer deposition;

Step 4) performing a rapid thermal anneal of the high K dielectric film at the temperature of about 600-1000° C. for about 10-120 seconds;

Step 5) depositing a TaN metal gate electrode film, which could be accomplished by reactively sputtering with Ta target in a mixed gas of $N_2$/Ar, or by MOCVD or ALD;

Step 6) depositing a polysilicon gate layer on the TaN metal gate electrode film, and then depositing a hard mask layer, wherein the hard mask layer is formed of , for example, silicon oxide, or silicon nitride, or a stack thereof (see FIG. 1, which shows an SEM (scanning electron microscope) image of the gate stack structure of the hard mask/polysilicon gate/ TaN metal gate electrode/high K dielectric/$SiO_2$ interfacial layer/silicon substrate which is obtained after the steps mentioned above);

Step 7) patterning a photoresist mask, and performing an anisotropic etching of the hard mask layer by reactive ion etching so as to transfer the pattern of the photoresist mask into the hard mask layer, wherein the hard mask layer is etched using a fluorine-based etchant, such as $CF_4$, $CHF_3$, and $SF_6$;

Step 8) removing the photoresist mask, and etching the polysilicon gate by reactive ion etching with the hard mask as masking layer using a mixed gas of $Cl_2$/HBr (see FIG. 2, which shows an SEM image of the stack structure obtained after the polysilicon is etched);

Step 9) etching the TaN metal gate electrode/high K dielectric stack by reactive ion etching with the hard mask as masking layer using $BCl_3$-based etchant gas, which is anisotropic dry etching with high selectivity. The $BCl_3$-based etchant gas is a mixed gas of $BCl_3$/$Cl_2$/Ar/a small amount of $O_2$, with a flow rate of $BCl_3$ of about 20-120 sccm, a flow rate of $Cl_2$ of about 5-30 sccm, a flow rate of $O_2$ of about 2-15 sccm, and a flow rate of Ar of about 10-60 sccm, and an etching power of an upper electrode is about 120-450 W and an etching power of a lower electrode is about 30-200 W. The reaction chamber is maintained at an operating pressure of about 4-15 mTorr. The temperatures of the reaction chamber and the electrodes are about 50-150° C. (see FIG. 3, which shows an SEM image of the gate stack structure obtained after a reactive ion etching of the TaN metal gate electrode/high K dielectric gate stack using a mixed gas of $BCl_3$/$Cl_2$/$O_2$/Ar at the end of the process).

The preferred embodiments of the present invention are described in the above paragraphs, but not construed as limiting the present invention. Many modifications, equivalence and variations of the preferred embodiments can be made without departing from the doctrine and spirit of the present invention as claimed.

What is claimed is:

1. A method of manufacturing a polysilicon gate/metal gate electrode/high K dielectric gate stack, comprising the steps of:

Step 1) forming an interfacial layer of SiON or $SiO_2$ on a silicon substrate;

Step 2) depositing a high K dielectric film on the interfacial layer;

Step 3) performing a rapid thermal anneal of the high K dielectric film;

Step 4) depositing a TaN metal gate electrode film on the high K dielectric film;

Step 5) depositing a polysilicon gate layer on the TaN metal gate electrode film, and then depositing a hard mask layer;

Step 6) patterning a photoresist mask, and performing an anisotropic etching of the hard mask layer by reactive ion etching so as to transfer the pattern of the photoresist mask into the hard mask layer;

Step 7) removing the photoresist mask, and etching the polysilicon gate by reactive ion etching with the hard mask as masking layer using a mixed gas of $Cl_2$/HBr; and Step 8) etching the TaN metal gate electrode/high K dielectric gate stack by reactive ion etching with the hard mask as masking layer using $BCl_3$-based etchant gas, which is anisotropic etching with high selectivity;

wherein in Step 8), the $BCl_3$ etchant is a mixed gas of $BCl_3$/$Cl_2$/Ar/$O_2$, with a flow rate of $BCl_3$ of about 20-120 sccm, a flow rate of $Cl_2$ of about 5-30 sccm, a flow rate of $O_2$ of about 2-15 sccm, and a flow rate of Ar of about 10-60 sccm; an etching power of an upper electrode is about 120-450 W and an etching power of a lower electrode is about 30-200 W; the reaction chamber is maintained at an operating pressure of about 4-15 mTorr; and the temperatures of the reaction chamber and the electrodes are about 50-150° C.

2. The method according to claim 1, wherein prior to Step 1), the silicon substrate is immersed into a washing solution for about 2-10 minutes, and the washing solution is a mixed solution of hydrofluoric acid, isopropanol and water in a volume ratio of about 0.2-1.5%:0.01-0.10%:1%.

3. The method according to claim 1, wherein in Step 1), the interfacial layer of SiON is formed by firstly implanting nitrogen ion and then performing rapid thermal oxidation, or by firstly performing oxidation and then performing plasma nitridation.

4. The method according to claim 1, wherein in Step 2), the high K dielectric film is a doped Hf-based oxide, which is one selected from the group consisting of $HfO_2$, HfON, HfSiO, HfSiON, HfraON, HfAlO, HfAlON, HfSiAlON, HfLaO, and HfLaON, and the high K dielectric film is formed by physical vapor deposition, or metal-organic chemical vapor deposition, or atomic layer deposition.

5. The method according to claim 1, wherein in Step 3), the rapid thermal anneal is performed at about 600-1000° C. for about 10-120 seconds.

6. The method according to claim 1, wherein in Step 4), the TaN metal gate electrode film is formed by reactively sputtering with Ta target in a mixed gas of $N_2$/Ar, or by metal-organic chemical vapor deposition, or by atomic layer deposition.

7. The method according to claim 1, wherein in Step 5), the hard mask layer is formed of silicon oxide, or silicon nitride or a stack thereof.

8. The method according to claim 1, wherein in Step 6), the hard mask layer is etched by reactive ion etching using a fluorine-based etchant.

9. The method according to claim 8, wherein the fluorine-based etchant is one selected from the group consisting of $CF_4$, $CHF_3$, and $SF_6$.

* * * * *